US008866256B2

(12) United States Patent
Newberry

(10) Patent No.: US 8,866,256 B2
(45) Date of Patent: Oct. 21, 2014

(54) UNBALANCED PARALLEL CIRCUIT PROTECTION FUSE DEVICE

(75) Inventor: William R. Newberry, Standish, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/601,510

(22) Filed: Aug. 31, 2012

(65) Prior Publication Data

US 2014/0061852 A1    Mar. 6, 2014

(51) Int. Cl.
H01L 23/525    (2006.01)

(52) U.S. Cl.
USPC ........... 257/529; 438/601; 438/131; 438/132; 438/215; 438/333

(58) Field of Classification Search
USPC ............................ 257/529, E23.149, E21.592
See application file for complete search history.

(56) References Cited

U.S. PATENT DOCUMENTS

| | | | |
|---|---|---|---|
| 4,042,950 A | 8/1977 | Price | |
| 5,166,547 A | 11/1992 | Babakanian et al. | |
| 5,264,725 A | 11/1993 | Mullarkey et al. | |
| 6,242,790 B1* | 6/2001 | Tsui et al. | 257/529 |
| 6,469,363 B1* | 10/2002 | Delpech et al. | 257/529 |
| 6,501,107 B1 | 12/2002 | Sinclair et al. | |
| 7,227,207 B2 | 6/2007 | Park et al. | |
| 7,425,472 B2 | 9/2008 | Marr | |
| 7,911,820 B2 | 3/2011 | Anand et al. | |
| 2008/0036568 A1* | 2/2008 | Makaran | 337/142 |
| 2010/0025812 A1* | 2/2010 | Fournier et al. | 257/529 |

OTHER PUBLICATIONS

Maier-Schneider et al., "Novel surface-micromachined low-power fuses for on-chip calibration", Infineon Technologies AG, 81541 Munich, Germany, Dec. 11, 2001, 6 pages.

* cited by examiner

Primary Examiner — Benjamin Sandvik
Assistant Examiner — Rodolfo Fortich
(74) Attorney, Agent, or Firm — Brake Hughes Bellermann LLP

(57) ABSTRACT

In one general aspect, an apparatus can include a semiconductor substrate, and a first conductive fuse bus having a triangular-shaped portion with a bottom surface aligned along a plane substantially parallel to a surface of the semiconductor substrate. The apparatus can include a second conductive fuse bus having a bottom surface aligned along the plane, and a plurality of fuse links coupled between the triangular-shaped portion of the first conductive fuse bus and the second conductive fuse bus.

20 Claims, 9 Drawing Sheets

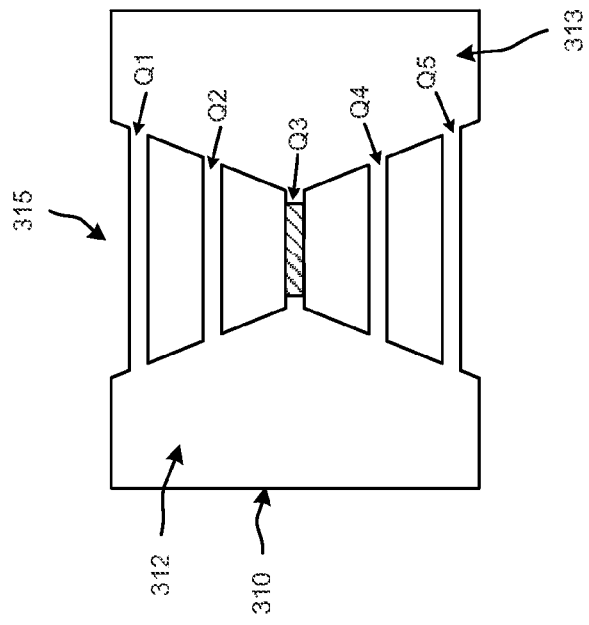
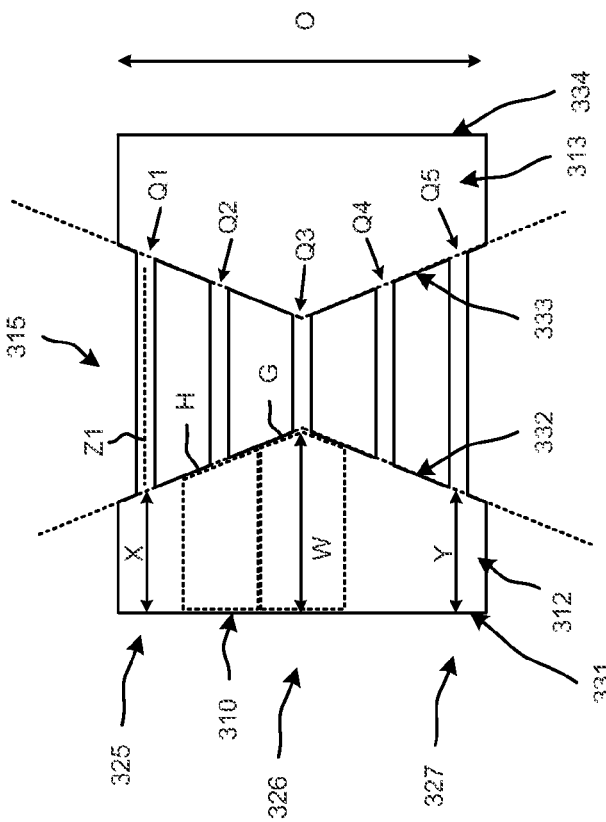
FIG. 3A
FIG. 3B

US 8,866,256 B2

UNBALANCED PARALLEL CIRCUIT PROTECTION FUSE DEVICE

TECHNICAL FIELD

This description relates to an unbalanced parallel circuit protection fuse device.

BACKGROUND

A variety of semiconductor components can be protected from undesirable power conditions (e.g., overcurrent conditions) using fuse devices. In some embodiments, the undesirable power conditions, which can include a voltage spike (related to power supply noise) and/or a current spike (caused by a downstream overcurrent event such as a short), may be produced by a power supply. Downstream components that can be protected by a fuse device can include electronic components (e.g., sensors, transistors, microprocessors, application-specific integrated circuits (ASICs), discrete components, circuit board) that could be damaged in an undesirable fashion (e.g., in a catastrophic fashion) by relatively fast increases in current and/or voltage produced by the power supply. Some known fuse devices can be bulky when packaged, are not compatible with semiconductor processing technologies, may not adequately (e.g., safely) protect a downstream and/or upstream components from voltage and/or current spikes, and/or so forth. Thus, a need exists for systems, methods, and apparatus to address the shortfalls of present technology and to provide other new and innovative features.

SUMMARY

In one general aspect, an apparatus can include a semiconductor substrate, and a first conductive fuse bus having a triangular-shaped portion with a bottom surface aligned along a plane substantially parallel to a surface of the semiconductor substrate. The apparatus can include a second conductive fuse bus having a bottom surface aligned along the plane, and a plurality of fuse links coupled between the triangular-shaped portion of the first conductive fuse bus and the second conductive fuse bus.

The details of one or more implementations are set forth in the accompanying drawings and the description below. Other features will be apparent from the description and drawings, and from the claims.

BRIEF DESCRIPTION OF THE DRAWINGS

FIG. 3A is a diagram that illustrates a conductive fuse layer, according to an embodiment.

FIGS. 3B through 3D illustrate the fuse link blow order with which the fuse links shown in FIG. 3A are blown.

DETAILED DESCRIPTION

Figure 1A:
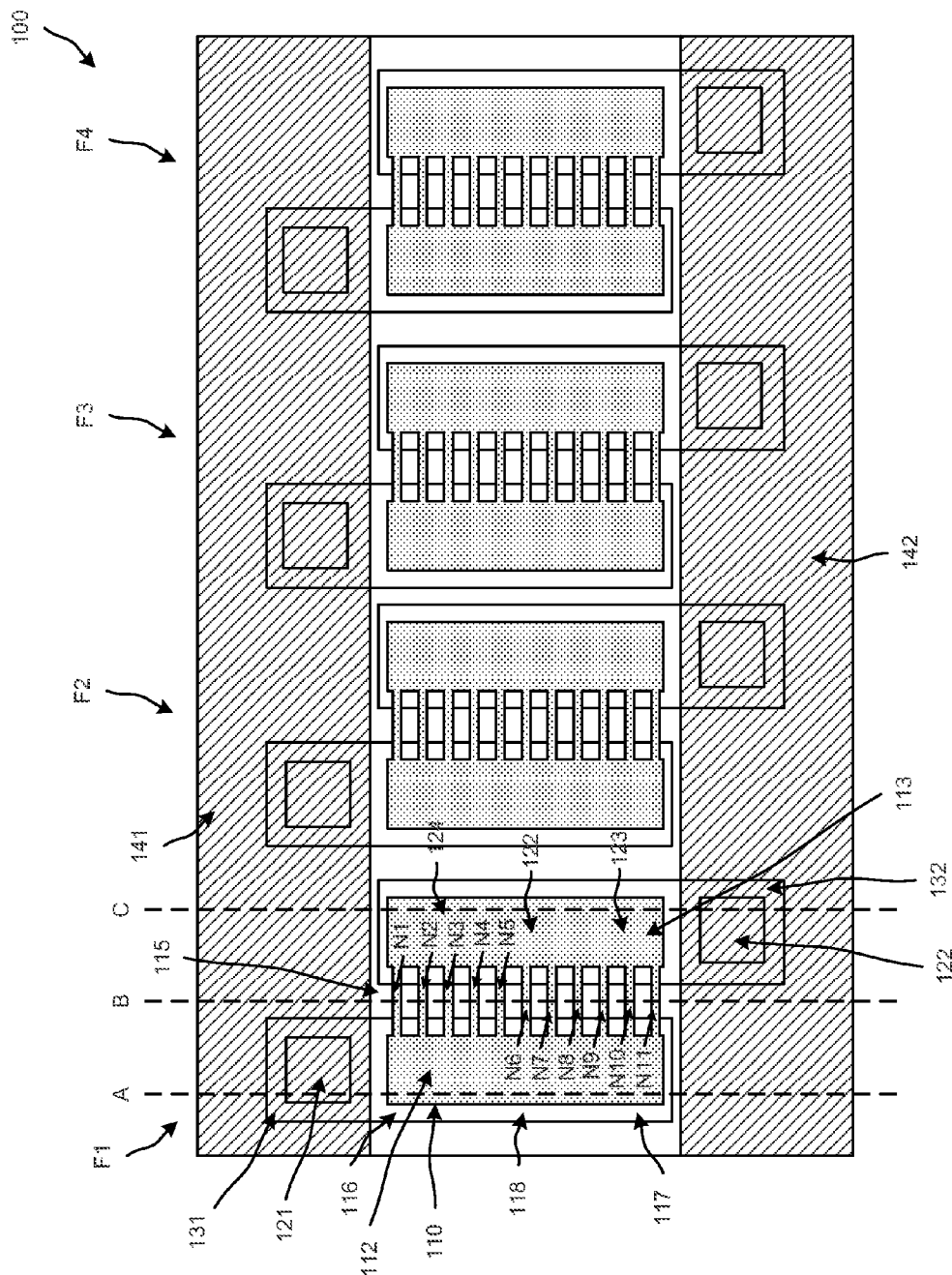
FIG. 1A is a block diagram that illustrates a fuse device.

FIG. 1A is a block diagram that illustrates a fuse device 100. As shown in FIG. 1A, the fuse device 100 includes several fuse stripes F1 through F4. Because the fuse stripes F1 through F4 in this embodiment are identical, or substantially identical, the features of the fuse device 100 will be discussed in terms of the fuse stripe F1. In some embodiments, the sizes, shapes, etc. of some of the fuse stripes can vary (e.g., may not be identical).

As shown in FIG. 1A the fuse stripe F1 includes a conductive fuse layer 110. In this implementation, the conductive fuse layer 110 includes conductive fuse buses 112, 113. In some embodiments, the conductive fuse bus 112 on the left-side of the fuse stripe Fl (when oriented as shown in FIG. 1A) can be referred to as a left-side (or first side) conductive fuse bus 112, and the conductive fuse bus 113 on the right-side of the fuse stripe F1 (when oriented as shown in FIG. 1A) can be referred to as a right-side (or second side) conductive fuse bus 113.

Several fuse links N1 through N11 are coupled between the conductive fuse bus 112 and the conductive fuse bus 113. The fuse links N1 through N11 can collectively be referred to as fuse links 115. Although fuse stripe F1 includes an odd number of fuse links 115, in some embodiments, the fuse stripe F1 can include an even number of fuse links 115.

The fuse device 100 is configured so that when a current through the fuse device 100 from the conductive runner 141 to the conductive runner 142 (or vice versa) exceeds a threshold current, the fuse device 100 will change from a shorted state (e.g., a conducting or conductive state) to an open state (e.g., a non-conducting state, a high resistance state). The fuse stripe F1 if the fuse device 100 can be referred to as being blown when in the open state. When in the fuse stripe F1 of the fuse device 100 is in an open state, the fuse links 115 (e.g., all of the fuse links 115) can be blown so that current is prevented (or substantially prevented) from flowing from the conductive runner 141 to the conductive runner 142. When in the shorted state, current can flow from the conductive runner 141 to the conductive runner 142 via the fuse stripes F1 through F4. The fuse links 115 are shown in FIG. 1A in the shorted state.

When in the open state, the fuse links 115 can be physically broken or disconnected (not shown in FIG. 1A). In some embodiments, the fuse links 115 can be configured to chemically change state and may not be physically broken or disconnected when changing from the shorted state to the open state. In some embodiments, one or more of the fuse links 115 can be configured to change from a conducting material to an insulating material when changing from the shorted state to the open state. For example, if one of the fuse links 115 is made of a polysilicon material, the fuse link can be configured to change from the poly silicon material when in the shorted state to a silicon dioxide ($SiO_2$) material when in the open state. In some implementations, one or more of the fuse links 115 may not become physically broken or disconnected when changing from the polysilicon material to the $SiO_2$ material. The polysilicon material can be a relatively conductive material that permits current flow and the $SiO_2$ material can be a relatively high resistance material that prevents (or substantially prevents) current flow.

In some implementations, the fuse device 100 can be configured to provide power protection (as a fuse) to a load from one or more undesirable power conditions. In some embodiments, the undesirable power conditions (which can include an overvoltage condition and/or an overcurrent condition) such as a voltage spike (related to power supply noise) and/or a current spike (caused by a downstream overcurrent event such as a short) may be produced by a power supply. For example, the load (also can be referred to as downstream components) may include electronic components (e.g., sensors, transistors, microprocessors, application-specific integrated circuits (ASICs), discrete components, circuit board) that could be damaged in an undesirable fashion by relatively fast increases in current and/or voltage produced by the power supply. Accordingly, the fuse device 100 can be configured to detect and prevent these relatively fast increases in current and/or voltage from damaging the load and/or other components associated with the load (such as a circuit board).

Because each of the fuse stripes F1 through F4 includes multiple fuse links such as fuse links 115 included in fuse stripe F1, each of the fuse stripes F1 through F4 can have a relatively low total resistance. For example, fuse stripe F1 can have a total resistance at a rated current that is lower than a total resistance of a fuse stripe that includes less fuse links or a single fuse link at the same rate current. Also, because the fuse device 100 includes multiple fuse stripes F1 through F4, the total resistance of the fuse device 100 can be relatively low compared with a fuse device including less fuse stripes (e.g., a single fuse stripe). As will be discussed in more detail below, having multiple fuse stripes in parallel, and/or one or more fuse stripes each have multiple fuse links in parallel, can enable the manufacture of a relatively low resistance fuse using a semiconductor process (e.g., a standard or typical semiconductor process). Producing one or more fuse structures having a desirable current rating (e.g., desirable characteristics) using a semiconductor process may not be possible without multiple fuse stripes in parallel and/or one or more fuse stripes each have multiple fuse links in parallel.

In some implementations, the configuration of the fuse device 100, which results in a relatively low total resistance, can enable the use of a relatively high resistance polysilicon or a silicided polysilicon for the conductive fuse layer 110 at a specified rated current rather than, for example, a relatively low resistance material such as a metal. The parallel connections (which are electrically parallel from a circuit perspective as well as physically parallel in this embodiment) of the fuse links 115 within, for example, fuse stripe F1 allows for use of a relatively high resistance material to produce a fuse that has a relatively low overall resistance even with the use of the relatively high resistance material (such as polysilicon). In some embodiments, the fuse device 100 can have a conductive fuse layer 110 of a polysilicon material that can have a resistance between approximately $1 \times 10^{-6}$ ohm-m and $1 \times 10^{-7}$ ohm-m. In contrast, the resistance of a copper or aluminum fuse can be between approximately $1 \times 10^{-8}$ ohm-m and $3 \times 10^{-8}$ ohm-m. In some implementations, a current rating of the fuse device 100, or a portion thereof (e.g., fuse stripe F1), can be defined (or adjusted) by a number of fuse links (e.g., fuse links 115).

One or more of the fuse stripes F1 through F4 can be configured so that the fuse links 115 of each of the fuse stripes F1 through F4 will blow (or change to an open state) in an order (e.g., a specified order, a predefined order, a target order). In some implementations, the order with which the fuse links 115 are blown can be referred to as fuse link blow order, as a fuse link blow pattern, a fusing order, or as a fusing pattern. In some embodiments, the fuse link blow order can be a predefined order. One or more of the fuse stripes F1 through F4 can be configured so that the fuse links 115 of each of the fuse stripes F1 through F4 will blow in an order until all of the fuse links 115 are blown or in an open state. In some implementations, one or more of the fuse stripes F1 through F4 can be configured so that each of their respective fuse links 115 will blow in a cascaded fuse link blow order (also can be referred to as a domino fuse link blow order, a sequential fuse link blow order, or a serial fuse link blow order). Because the fuse links 115 can blow in a specified order and are electrically in parallel with one another, the fuse device 100 can be referred to as an unbalanced parallel circuit protection fuse device. The term unbalanced is derived from the configured functionality that results in some of the fuse links 115 blowing before other of the fuse links 115.

As a specific example, the conductive fuse buses 112, 113 and one or more of the fuse links 115 can be configured so that the fuse links 115 will blow in an order starting with fuse link N1 and ending with fuse link N11. In some implementations, the conductive fuse buses 112, 113 and one or more of the fuse links 115 can be configured so that the fuse links 115 will blow starting with one (e.g., a single) or more (e.g., a pair, more than two) of the fuse links disposed in the middle portion 122 of the fuse links 115 (e.g., fuse link N5, N6, and/or N7) and ending with fuse links 115 at the end portions 123, 124 (e.g., outer end portions) of the fuse links 115 (e.g., fuse link N1, N2, N10, and/or N11).

In some embodiments, the fuse link blow order with which the fuse links 115 blow can be described in terms of direction. For example, if the fuse links 115 blow in order from fuse link N1 to fuse link N11, the fuse links 115 can be referred to as blowing in a direction from fuse link N1 to fuse link N11. As another example, if the fuse links 115 blow starting with one or more of the fuse links disposed in the middle portion 122 of the fuse links 115 and ending with fuse links 115 at the end portions 123, 124 of the fuse links 115, the fuse links 115 can be referred to as blowing in an outward direction from the middle portion 122 of the fuse links 115.

The conductive fuse layer 110 (e.g., the conductive fuse buses 112, 113, the fuse links 115) and/or the conductive contact layers 131, 132 can be configured to produce a gradient in the current density (which can be expressed in amperes (A) per unit area (e.g., $m^2$)) within the conductive fuse layer 110 so that the fuse links 115 are blown in a specified fuse link blow order. The current density gradient can be defined to reduce the rated current of the fuse device 100 without increasing the overall resistance of the fuse device 100 in an undesirable fashion. In other words, current within the fuse device 100 (e.g., within fuse stripe F1) can be directed or routed so that the fuse links 115 are blown in a specified fuse link blow order. In some embodiments, the current density gradient can reduce the rated current of the fuse device 100 without increasing the overall resistance of the fuse device 100. This can enable the fuse device 100 resistance and current rating to be compatible with, for example, traditional metal fuses.

For example, the current density can be relatively low at the ends 116, 117 of the conductive fuse bus 112 disposed near the conductive runners 141, 142, and the current density can be relatively high toward the middle portion 118 of the conductive fuse bus 112 between the end portions 116, 117 of the conductive fuse bus 112. The pattern of the current density can cause the middle portion 122 of the fuse links 115 to blow before one or more of the end portions 123, 124 of the fuse links 115 in response to a current applied to the fuse stripe F1. The pattern of the current density can be approximately the same (or mirrored) in the conductive fuse bus 113. In some implementations, the pattern of the current density can be defined to cause the middle portion 122 of the fuse links 115 to blow after, or approximately at the same time as, one or more of the end portions 123, 124 of the fuse links 115 in response to a current applied to the fuse stripe F1.

In some embodiments, a pattern of the current density within the conductive fuse layer 110 can be defined by a shape of the conductive fuse layer 110. A shape of at least a portion of the conductive fuse layer 110 can be defined so that the pattern of the current density within the conductive fuse layer 110 can cause the fuse links 115 to blow in a specific order. Although not shown in FIG. 1A, a width (from the left-side to the right-side (or vice versa) of the figure), a thickness (in a direction into or out of the page of the figure), and/or a length (from the top to the bottom (or vice versa) of the figure) of the conductive fuse bus 112 can be relatively small along one or more of the end portions 116, 117 and can be relatively large along the middle portion 118 so that the fuse links 115 are blown starting in the middle portion 122 of the fuse links 115 and cascading out toward one or more of the end portions 123, 124 of the fuse links 115, or vice versa. In some embodiments, a width, a thickness, and/or a length of the conductive fuse bus 112 can vary so that the fuse links 115 are blown starting at the end portion 123 (e.g., fuse link N1.1) of the fuse links 115 and proceeding (e.g., proceeding sequentially) toward the end portion 124 (e.g., fuse link N1) of the fuse links 115, or vice versa. Various shapes that can cause a variety of fuse link blow orders are described in connection with the figures below.

In some embodiments, the middle portion 122 of the fuse links 115 can have a different shape (e.g., have a smaller or larger cross-sectional area along cut line B, have a smaller or larger width aligned along cut line B, have a smaller or larger length between the conductive fuse buses 112, 113) than one or more of the end portions 123, 124 of the fuse links 115. In some embodiments, the space (e.g., distance) between fuse links 115 (e.g., the distance between fuse link N5 and fuse link N6) can be varied along the fuse links 115 to cause the fuse links 115 to be blown in a specified order. In some embodiments, the space between a pair of the fuse links 115 can be referred to as a fuse link spacing or fuse link distance. As shown in FIG. 1A, the cut line B is perpendicular to an axis (also can be referred to as a longitudinal axis or line) along which at least some of the fuse links 115 are aligned.

For example, a distance between pairs of fuse links included in the middle portion 122 of the fuse links 115 (e.g., fuse link N5 and fuse link N6) can be different than (e.g., greater than, less than) a distance between pairs of fuse links included in one or more of the end portions 123, 124 (e.g., fuse link N1 and fuse link N2) of the fuse links 115. In some embodiments, the distance between, for example, pairs of fuse links from the end portion 123 to the end portion 124 can increase (e.g., monotonically increase), decrease (e.g., monotonically decrease), or can be the same (or substantially the same).

Although not shown in FIGS. 1A through 1D, in some embodiments, the fuse links 115 can have curved portions. Although not shown in FIGS. 1A through 1D, in some embodiments, the fuse links 115 can have bent portions. For example, one or more of the fuse links 115 can have a first portion aligned along a first axis (or line) that is at an angle (e.g., 20° angle, 45° angle, 70° angle) with respect to a second axis (or line) along which a second portion is aligned.

As shown in FIGS. 1A through 1D, the fuse links 115 are aligned parallel to one another, in some embodiments, several of the fuse links 115 may not be aligned in a parallel fashion. For example, a first fuse link from the fuse links 115 can be aligned along a first axis (or line) that is at an angle (e.g., 5° angle, 10° angle, 20° angle, 45° angle, 70° angle) with respect to a second axis (or line) along which a second fuse link from the fuse links 115 is aligned.

In some embodiments, a pattern of the current density within the conductive fuse layer 110 can be defined by a material (or material profile) of the conductive fuse layer 110. In other words, a property (e.g., a characteristic) of a material of at least a portion of the conductive fuse layer 110 can be varied in a specified (or predefined) fashion so that the pattern of the current density within the conductive fuse layer 110 can cause the fuse links 115 to blow in a specific order. For example, a material of the conductive fuse layer 110 and/or the conductive contact layers 131, 132 can be defined so that the fuse links 115 are blown a specified order. As a specific example, a resistance of the conductive fuse bus 112 can be relatively low along one or more of the end portions 116, 117 (based on a material property) and can be relatively high along the middle portion 118 (based on the material property) so that the fuse links 115 are blown starting in the middle portion 122 of the fuse links 115 and proceeding (e.g., cascading) out toward the end portions 123, 124 of the fuse links 115. In other words, the conductive fuse bus 112 can be configured with a resistance gradient that defines a fuse link blow order of the fuse links 115.

In some implementations any combination of materials and/or shapes can be used to cause fuse links (e.g., fuse links 115 to blown a specified order. More details related to combinations of materials and/or shapes that can be used to cause fuse links to blown a specified order are described below.

Figure 2:
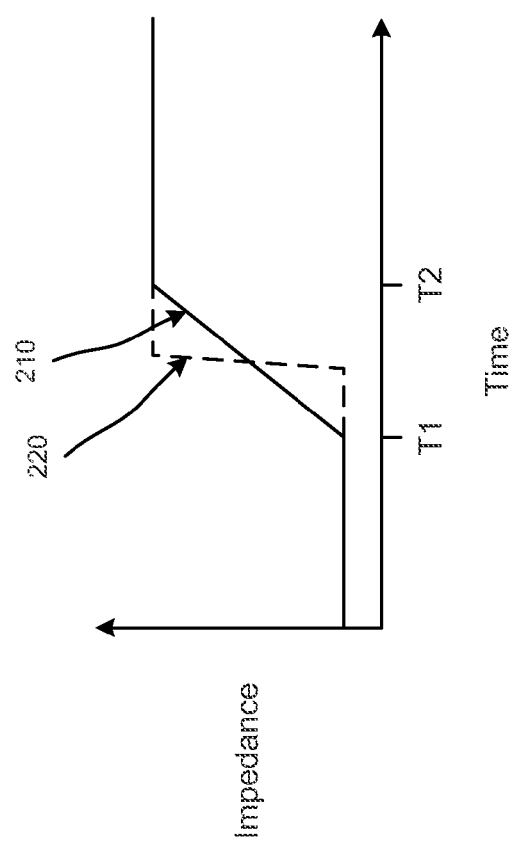
FIG. 2 is a graph that illustrates a change in impedance across the fuse device shown in FIG. 1A.

Because the fuse device 100 includes multiple links in the fuse links 115 that blow in a specified order rather than a single link, the impedance of the fuse device 100 can change in a relatively slow fashion rather than instantaneously. For example, FIG. 2 is a graph that includes a curve 210 that represents a change in impedance across (e.g., from an input to an output of) the fuse device 100 as the fuse links 115 blow. In FIG. 2 time is shown along the x-axis and impedance is shown on the y-axis. Curve 220 represents a change in impedance across a fuse device that includes a single link that is approximately equivalent (e.g., equivalent in impedance, equivalent in size) to the collective fuse links 115 of the fuse device 100.

As shown in curve 210 in the graph, a time period (shown between times T1 and T2) during which the fuse links 115 blow is significantly longer than a time period during which the single fuse link blows as shown in curve 220. In some embodiments, the time period during which the fuse links 115 blow (e.g., blow in a specified order) can be referred to as a fuse blow time period. A first fuse link (or first set of fuse links) from the fuse links 115 can blow at approximately time T1 and a last fuse link (or last set of fuse links) from the use links 115 can blow at approximately time 12. The fuse links can blow in a cascaded fashion between times T1 and 12. In some embodiments, the fuse blow time period between times T1 and T2 can be non-linear. For example, the impedance of the curve 210 can increase at a faster rate (e.g., at a slightly faster rate) closer to time T2 than to time T1 as fuse links blow in a cascaded fashion.

In some implementations, fuse blow time period of the fuse device 100 can be increased or decreased by changing a size, a resistance, a shape, etc. of the fuse device 100. In some embodiments, the relatively slow fuse blow represented in curve 210 of FIG. 2 can reduce voltage spikes that can be associated with a relatively rapid change in impendence (e.g., the relatively rapid change in impedance represented by curve 220 of FIG. 2), for example, cause damage to one or more semiconductor device electrically coupled to the fuse device 100. In some embodiments, a rapid change in impedance can result in a voltage spike. In some instances, the voltage spike can produce an arc across, for example, an open fuse which can result in damage to a circuit (e.g., a downstream circuit, an upstream circuit) coupled to the fuse. In some embodiments, reducing the rate of change in impedance can reduce the likelihood of producing an arc across the open fuse in an undesirable fashion.

In some implementations, the fuse links 115 can be configured so that the fuse device 100 will blow (e.g., open) in accordance with a predefined set of specifications. For example, the fuse device 100 can be configured to conduct, without blowing, a current at a hold current value (or within a hold current range), and can be configured to blow within a specified time period (e.g., within a few minutes, within a few hours) in response to a current through the fuse device 100 increasing over a slow blow current value (or within a slow blow current range). The fuse device 100 can be configured to blow at a relatively rapid rate in response to a current above a fast blow current value (or within a fast blow current range).

For example, the fuse device 100 can be configured to indefinitely conduct a current at a hold current value of approximately 1 amperes (A), and can be configured to blow within a specified period of time (e.g., less than 24 hours, less than a few hours, less than a few minutes) when a current through the fuse device 100 is at a slow blow current value of approximately 3 A. The fuse device 100 can be configured to blow at a relatively fast rate when a current through the fuse device 100 increases beyond a fast blow current value of approximately 6 A. In some embodiments, a hold current range can be between 0 A to 2.5 A, a slow blow current range can be between 2.5 A to 6 A, and a fast blow current range can be any current above 6 A.

In some embodiments, the side of the fuse links 115 of the fuse stripe F1 into which current is initially received can be referred as an input. For example, if current is initially received on the left side of the fuse stripe F1, the conductive fuse bus 112 can be referred to as an input conductive fuse bus, the conductive contact layer 131 can be referred to as an input conductive contact layer, and the conductive runner 141 can be referred to as an input runner. Accordingly, if current exits on the right side of the fuse stripe F1, the conductive fuse bus 113 can be referred to as an output conductive fuse bus, the conductive contact layer 132 can be referred to as an output conductive contact layer, and the conductive runner 142 can be referred to as an output runner. In this example embodiment, current can flow from the conductive runner 141 through a via 121 (which can be referred to as an input via) into the conductive contact layer 131 and the conductive fuse bus ill. The current can then flow through the fuse links 115 into the conductive fuse bus 113 and the conductive contact layer 132, through a via 122 (which can be referred to as an output via) and finally into the conductive runner 142. In some embodiments, the fuse device 100 can be configured so that current flows through the fuse device 100 in the opposite direction. The vias 121, 122 can be included in a via layer.

In some embodiments, at least some portions of the fuse stripe F1 can be formed using semiconductor processing techniques. The semiconductor processing techniques can include various masking steps, etching steps, deposition steps, doping steps, and/or so forth. The fuse stripe F1 can be formed in conjunction with other semiconductor devices (e.g., metal-oxide-semiconductor field-effect transistor (MOSFET), bipolar junction transistor (BJT), diode devices) that can be formed in the substrate 150. In other words, at least some portions of the fuse stripe F1 can be formed while forming portions of other semiconductor devices. Producing the fuse device 100 using semiconductor materials such as polysilicon, metals, etc. and semiconductor processing enables integration with other semiconductor devices as well as low cost, high volume manufacturing (e.g., reduced size, reduced cost).

Figure 1B:
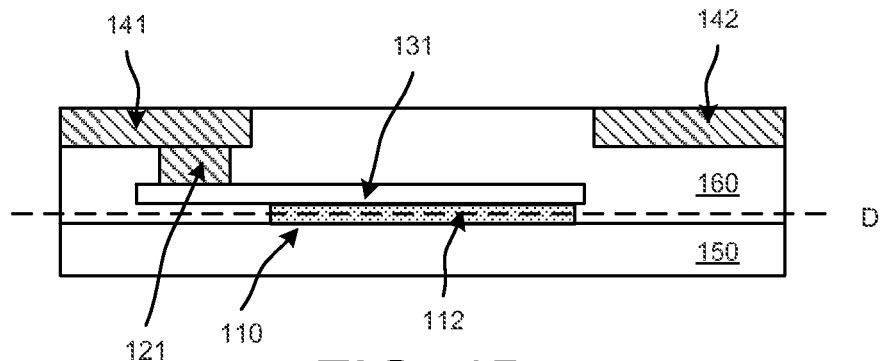
FIGS. 1B through 1D are a diagram that illustrate side cross-sectional views of portions of the fuse device shown in FIG. 1A.

FIG. 1B is a diagram that illustrates a side cross-sectional view of the fuse stripe F1 cut along line A through the left-side conductive fuse bus 112. As shown in FIG. 1B, the left-side conductive fuse bus 112 (which is part of conductive fuse layer 110) is coupled to the conductive runner 141 through the via 121 and a conductive contact layer 131. As shown in FIG. 1B, the conductive fuse layer 110 (e.g., a bottom surface of the conductive fuse layer 110) is disposed on (e.g., is in contact with) a substrate 150. At least some portions of the conductive runner 141 are insulated from the conductive fuse layer 110 by an insulating material 160. In some embodiments, the insulating material 160 can be a dielectric material such as silicon dioxide, a thermal oxide material or layer, a deposited oxide material or layer, a low-K dielectric material, and/or so forth. In this side cross-sectional view, the conductive runner 142 is isolated from (e.g., insulated from by the insulating material 160) the conductive fuse layer 110, the conductive contact layers 131, 132, and so forth.

Figure 1C:
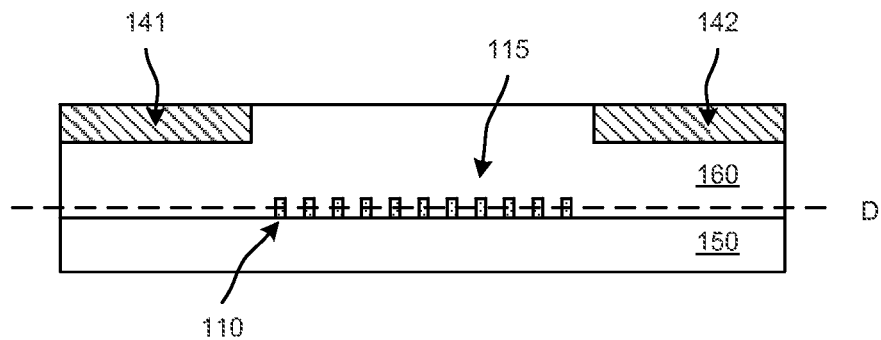
Figure 1D:
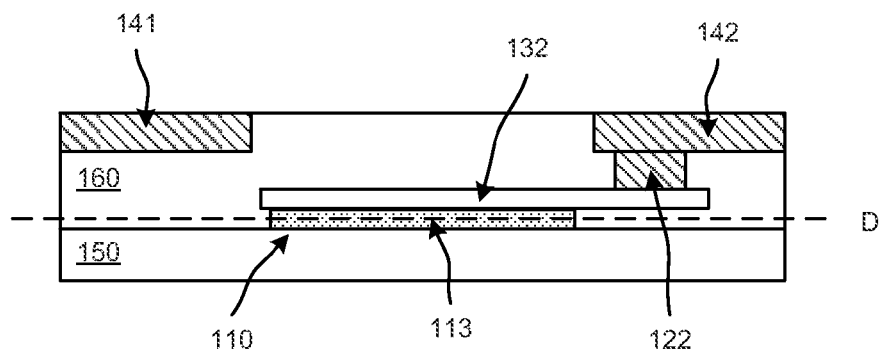

As shown in FIGS. 1B through 1D, the conductive fuse layer 110 is disposed between the multiple layers (e.g., insulating material 160, substrate 150, via layers, metal layers, and/or so forth). Although not shown in FIGS. 1B through 1D, in some embodiments, the conductive fuse layer 110 can be insulated from the substrate 150 by for example, an insulating material such as a dielectric, an oxide, and/or so forth.

In some embodiments, the conductive fuse layer 110 can be monolithically formed using one or more semiconductor processing steps. In some embodiments, in other words, the fuse links 115 can be formed simultaneously with (e.g., using the same processing as) the conductive fuse buses 112, 113. Accordingly, the fuse links 115 and the conductive fuse buses 112, 113 can collectively be considered a single monolithic unit. In some embodiments, the conductive fuse buses 112, 113, although monolithically formed along with the fuse links 115, can be considered (or referred to as) fuse links that are coupled to the conductive fuse buses 112, 113.

After the conductive fuse layer 110 has been disposed on the substrate 150, the conductive contact layer 131 can be disposed on (e.g., in direct contact with, physically in contact with) the conductive fuse layer 110. An opening for the via 121 can be formed in the insulating material 160 so that the via 121 can be disposed in the opening to electrically couple the conductive runner 141 to the conductive contact layer 131.

In some embodiments, the insulating material 160 can be formed in various stages as the conductive fuse layer 110, the conductive contact layer 131, the via 121, and the conductive runner 141 are formed. For example, in some embodiments, a portion of the insulating material 160 can be formed on the substrate 150, after which an opening in the shape of the conductive fuse layer 110 can be formed. Excess portions of the conductive fuse layer 110 can be etched. Following the etching of the conductive fuse layer 110, additional portions of the insulating material 160 can be formed. The insulating material 160 described herein can be a dielectric formed using any combination of thermal growth techniques, deposition techniques. For example, the insulating material 160 can include a thermally grown oxide, a low-k dielectric, and/or so forth.

In some embodiments, one or more portions of the substrate 150 can include, for example, Silicon (Si), Germanium (Ge), Silicon Germanium (SiGe), Gallium Arsenide (GaAs), Silicon Carbide (SiC), type III-V semiconductor substrates, type II-VI semiconductor substrates, and/or so forth. In some embodiments, one or more of the features included in the fuse device 100 can be formed using a chemical and/or mechanical polishing processing step. More details related to semiconductor processing steps used to form, for example, the fuse device 100 are described in connection with at least FIG. 8.

FIG. 1C is a diagram that illustrates a side cross-sectional view of the fuse stripe F1 cut along line B through the fuse links 115 of the conductive fuse layer 110. As shown in FIG. 1C, the fuse links 115 are disposed on the substrate 150. At least some portions of the conductive runners 141, 142 are insulated from the conductive fuse layer 110 by the insulating material 160. As shown in FIG. 1C, each of the fuse links 115 has an identical cross-sectional area and even fuse spacing. In some embodiments, one or more of the fuse links 115 can have a different cross-sectional area. In some embodiments, a first pair of the fuse links 115 can have a different fuse spacing than a second pair of the fuse links 115.

FIG. 1D is a diagram that illustrates a side cross-sectional view of the fuse stripe F1 cut along line C through the right-side conductive fuse bus 113. FIG. 11) has many of the same features as FIG. 1B, but orientation in an opposite direction. As shown in FIG. 1B, the right-side conductive fuse bus 113 (which is part of conductive fuse layer 110) is coupled to the conductive runner 142 through the via 122 and a conductive contact layer 132. As shown in FIG. 1D, the conductive fuse layer 110 is disposed on a substrate 150 (e.g., a silicon substrate). At least some portions of the conductive runner 141 are insulated from the conductive fuse layer 110 by an insulating material 160.

As shown in FIGS. 1B through 1D, the conductive fuse layer 110 is aligned along plane D. Accordingly, the left-side conductive fuse bus 112 (shown in FIG. 1B), the right-side conductive fuse bus 113 (shown in FIG. 1D), and the fuse links 115 (shown in FIG. 1C), which are all included in the conductive fuse layer 110 are aligned along plane D. For example, a bottom surface of the left-side conductive fuse bus 112 (shown in FIG. 1B), a bottom surface of the right-side conductive fuse bus 113 (shown in FIG. 1D), and a bottom surface of the fuse links 115 (shown in FIG. 1C), which are all included in the conductive fuse layer 110, can be aligned along plane D. The plane D can be parallel to a top surface or a bottom surface of the substrate 150.

Although not shown in FIG. 1B through 1D, in some embodiments, portions of the conductive fuse layer 110 (e.g., the fuse links 115) can have portions that are not aligned along (or within) plane D. In some embodiments, for example, one or more of the fuse links 115 can have portions that are above or below plane D. For example, one or more of the fuse links 115 can have a first portion aligned along plane D and can have a second portion that is aligned along an axis (or line) that is at an angle (e.g., 20° angle, 45° angle, 70° angle) with respect to the plane D or is normal to the plane D.

The conductive fuse layer 110 can be made of a variety of materials such as polysilicon, a silicide material (e.g., a nickel silicide material, a titanium silicide material), a metallic material or a metal-based material (e.g., aluminum, copper, gold, titanium, a metallic alloy), and/or so forth. In some embodiments, the conductive fuse buses 112, 113 and one or more of fuse links 115, which are included in the conductive fuse layer 110, can be made of the same material or different materials. For example, in some implementations, the conductive fuse buses 112, 113 can be made of a silicide material and one or more of the fuse links 115 can be made of a polysilicon material.

As discussed briefly above, the left-side conductive fuse bus 112 is coupled to the conductive runner 141 through the via 121 and the conductive contact layer 131. Similarly, the right-side conductive fuse bus 113 is coupled to the conductive runner 142 through the via 122 and the conductive contact layer 132. In some embodiments, the conductive runner 141, 142 and/or the conductive contact layers 131, 132 can be made of a variety of materials such as a metallic material or a metal-based material (e.g., aluminum, copper, gold, titanium, metallic alloy), a polysilicon material, and/or so forth. In some embodiments, at least a portion of the conductive contact layer 131, a portion of the conductive runner 141, and/or a portion of the conductive runner 142 can be made of the same material or of different materials, in some embodiments, at least a portion of the conductive contact layer 131, a portion of the conductive runner 141, and/or a portion of the conductive runner 142 can be made of the same material as the conductive fuse layer 110.

Any of the conductive layers, such as the vias 121, 122, the conductive fuse layer 110, the conductive contact layers 131, 132, the conductive runners 141, 142 can be formed using a deposition process such as a chemical vapor deposition (CVD) processing step, a sub-atmospheric chemical vapor deposition (SACVD) processing step, and/or so forth. For example, the conductive fuse layer 110 can be disposed on (e.g., in direct contact with, physically in contact with) the substrate 150 using a CVD process, in some embodiments, openings (e.g., openings for the vias 121, 122) can be formed using one or more photolithography and/or etching processing steps including, for example, wet etch processing steps, dry etch processing steps, photolithography exposure and/or masking steps, and/or so forth.

As discussed above, the fuse device 100 can change to an open state, or start to change to an open state, when one or more of the fuse links 115 changes to a high resistance state. For example, when the fuse links 115 are made of a polysilicon material that is embedded in a silicon-oxide dielectric (i.e., insulating material 160), the polysilicon material of the fuse links 115 can become oxidized and can be converted to an insulator when heated in response to current through the fuse links 115 beyond a threshold current (e.g., a slow blow current value, a fast blow current value). This physical transformation (rather than link breakage that occurs in a metallic fuse) eliminates the possibility of fuse grow back from occurring so that a new conductive fuse link is reformed as can occur in metallic fuses. Because the fuse links 115 are also embedded in a dielectric, the chance of electrical arcing across an open circuit (as can occur in a metallic fuse) after the one or more of the fuse links 115 have been blown (e.g., fused) is significantly reduced. When the fuse links 115 are made of polysilicon material embedded in silicon oxide, an air gap upon fuse blow (as can occur in a metallic fuse) will not occur. In some embodiments one or more of the fuse links 115 can be made of a material that melts (e.g., a metal) and physically deforms (or changes shape) when blown to form an open circuit.

In some embodiments, the material used to make the conductive fuse layer 110 of the fuse device 100 can be made of a material that has a positive temperature coefficient (PTC) so that the resistance of the material increases with increasing temperature. For example, the conductive fuse layer 110 can be made of a polysilicon material that has a positive temperature coefficient. Accordingly, when the conductive fuse layer 110 of the fuse device 100 heats as current flows through the conductive fuse layer 110, the resistance across of the conductive fuse layer 110 can increase. The increase in resistance can further cause an increase in the temperature of the conductive fuse layer 110. This positive feedback cycle, can in some embodiments, contribute to the fuse links 115 of the conductive fuse layer 110 to quickly blow (e.g., blow in a cascaded fashion) in response to current through the conductive fuse layer 110 exceeding a threshold value (e.g., a slow blow current value, a fast blow current value). In some embodiments, this condition can be referred to as thermal runaway.

In some embodiments, as the fuse links 115 blow, the current densities through the remaining fuse links 115 can increase. This can result in a faster blow time period for the remaining fuse links 115. For example, before fuse link N1 blows, the current density into the fuse stripe F1 will be divided between fuse links N1 through N11. After fuse link N1 blows, the current density into the fuse stripe F1 (provided that the current in the fuse stripe F1 does not substantially decrease) will be divided between fuse links N2 through N11. This can result in an incremental increase in current density through N2 through N11 and can result in a relatively faster blow time for fuse links N2 through N11 than if fuse link N1 had not blown.

The embodiments and examples shown and described in connection with FIGS. 1A through 2 described above can be combined with any of the embodiments, or features, described in connection with the figures below.

Figure 3D:
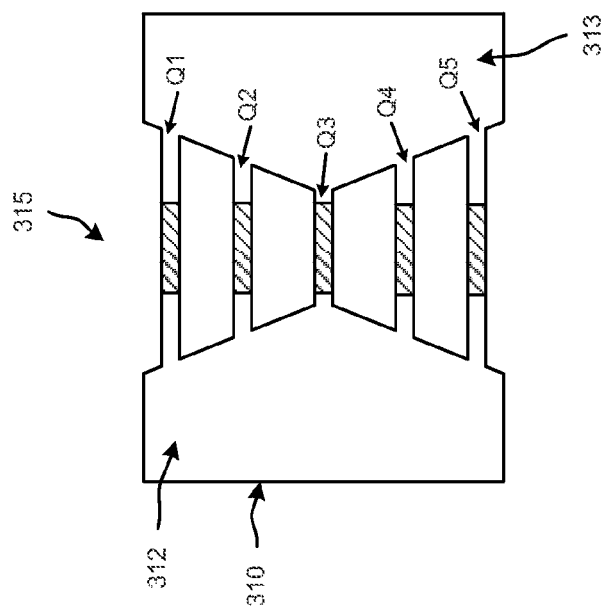

FIG. 3A is a diagram that illustrates a conductive fuse layer 310, according to an embodiment. The conductive fuse layer 310 includes a left-side conductive fuse bus 312 and a right-side conductive fuse bus 313. The conductive fuse layer 310 includes fuse links 315. The fuse links 315 include fuse links Q1 through Q5. In some embodiments, the conductive fuse layer 310 can be included in a fuse device such as the fuse device 100 shown in FIGS. 1A through 1D. Each of the elements of the conductive fuse layer 310, including the fuse links 315, the left-side conductive fuse bus 312, and the right-side conductive fuse bus 313 can be aligned within the same plane. As shown in FIGS. 3A through 3D, the fuse links 315 are coupled to an edge 332 (illustrated by a dashed line) of the left-side conductive fuse bus 312 and are coupled to an edge 333 (illustrated by a dashed line) of the left-side conductive fuse bus 313. In some embodiments, the edges 332, 333 can be referred to as inner edges.

In this embodiment, the conductive fuse layer 310 is configured so that when current is applied to the conductive fuse layer 310, the fuse link Q3 will blow first (e.g., change to a high resistance state first). In this embodiment, the fuse link Q3 is illustrated as changing to a relatively high resistance material by the shaded area included in fuse link Q3 shown in FIG. 3B. After the fuse link Q3 has blown, the fuse links Q2 and Q4 will blow as illustrated by the shaded areas included in fuse links Q2 and Q4 shown in FIG. 3C. Finally, the fuse links Q1 and Q5 will blow after the fuse links Q2 and Q4 have blown as illustrated by the shaded area included in fuse links Q1 and Q5 shown in FIG. 3D.

In this embodiment, the conductive fuse layer 310 has a shape that causes the fuse link Q3 to blow before causing the other fuse links to blow in response to a current (e.g., a current above a threshold value). Specifically, the left-side conductive fuse bus 312 has a triangular shape (e.g., area, surface area, profile) with a width W at approximately a middle portion 326 of the conductive fuse layer 310 that is greater than a width X at approximately an end portion 325 of the conductive fuse layer 310 or a width Y at approximately an end portion 327 of the conductive fuse layer 310. In other words, a tip (also can be referred to as an apex or a point) of the triangular shape is associated with the fuse link Q3, which is targeted to blow first. In this embodiment, the conductive fuse layer 310 is configured so that the width of the left-side conductive fuse bus 312 is greater near (e.g., lateral to) the fuse link Q3, which is targeted for blowing first, than a width of a portion of the left-side conductive fuse bus 312 that is near (e.g., lateral to) the remaining fuse links Q1, Q2, Q4, and Q5, which are targeted for blowing subsequent to the fuse link Q3.

As shown in FIG. 3A, the left-side conductive fuse bus 312 has a length O greater than the width X, the width and the width W. Although not shown in FIG. 3A, the length O of the left-side conductive fuse bus 312 can be less than the width X, the width Y, and/or the width W.

In some embodiments, the fuse link targeted to blow first may not be coupled to a tip of a triangular-shaped conductive fuse bus. In this embodiment, the fuse links 315 include an odd number of fuse links. In some embodiments, the fuse links 315 can include an even number of fuse links. In such embodiments, more fuse links can be included above a fuse link associated with the tip of a triangular-shaped conductive fuse bus than below the fuse link associated with the tip of the triangular-shaped conductive fuse bus, or vice versa.

In some embodiments including even number of fuse links (or odd numbers of fuse links), multiple fuse links can be targeted to blow at the same time. In such embodiments, a conductive fuse bus can have a trapezoidal shape, and the fuse links targeted to blow first can be coupled to one of the parallel sides of the trapezoidal shape.

As shown in FIG. 3A, the width X is lateral to the fuse link Q1 and is aligned along an axis (or line) (e.g., axis Z1) along which the fuse link Q1 is also aligned. The width Y is lateral to the fuse link Q5 and is aligned along an axis (or line) along which the fuse link Q5 is also aligned. Similarly, the width W is lateral to the fuse link Q3 and is aligned along an axis (or line) along which the fuse link Q3 is also aligned. Each of the axes (e.g., axis Z1) along which the fuse links 315 are aligned are within (or aligned within) a plane within which the conductive fuse layer 310 is aligned.

As shown in FIG. 3A, the conductive fuse layer 310 has an area that tapers along the edge 332 from the middle portion 326 (near fuse link Q3) toward the end portion 325 (near the fuse links Q1 and Q2) and toward the end portion 327 (near the fuse links Q4 and Q5). Said differently, as shown in FIG. 3A, the conductive fuse layer 310 has an area that tapers along the edge 332 from the width W (near fuse link Q3) toward the width X (near the fuse link Q1) and toward the width Y (near the fuse link Q5). In other words, the conductive fuse layer 310 has an area tapering at least along the edge 332 from a first width at a first portion of the area (e.g., adjacent to fuse link Q1) to a second width at a second portion of the area (e.g., adjacent to fuse link Q3). Accordingly, in this embodiment, the inner edges 332, 333 of the conductive fuse layer 110 define a bow-tie shape.

In this embodiment, the width Y is the same as the width X. In some embodiments, the width Y can be different than the width X. In such embodiments, the tapering from the middle portion 326 to the end portion 325 can have a different profile and/or slope as the tapering from the middle portion 326 to the end portion 327.

As is the case with FIGS. 3A through 3D, a region (e.g., surface region or area, portion) of the conductive fuse layer 310 that is associated with a fuse link targeted to blow first can have the greatest surface area. For example, a region G shown in FIG. 3A of the conductive fuse layer 310 associated with (e.g., approximately centered about) fuse link Q3 is greater than a region H shown in FIG. 3A of the conductive fuse layer 310 associated with (e.g., approximately centered about) fuse link Q2.

The triangular shape (e.g., surface area, area, profile) of the conductive fuse layer 310 (e.g., the left-side conductive fuse bus 312) causes the current density across the fuse link Q3 to be greater than the current density across fuse link Q1, Q2, Q4, or Q5. Specifically, the greater surface area of the left-side conductive fuse bus 312 (if functioning as an input) results in relatively more current to be channeled to the fuse link Q3 than the remaining fuse links Q1, Q2, Q4, and Q5.

In this embodiment, the shape of the left-side conductive fuse bus 313 is a mirror image of the right-side conductive fuse bus 312. Accordingly, the conductive fuse bus 312 is symmetrical about a vertical line through (and orthogonal to (e.g., perpendicular to)) at least a portion of the fuse links 315. The edge 332 of the conductive fuse layer 310 (e.g., left-side conductive fuse bus 312) tapers away from the edge 333 of the conductive fuse layer 310 (e.g., right-side conductive fuse bus 313). In some embodiments, the left-side conductive fuse bus 313 can have a different shape than the right-side conductive fuse bus 312. In such embodiments, the conductive fuse bus 313 may not be symmetrical (e.g., may be asymmetrical).

In this embodiment, the fuse link Q3, which is targeted to blow first of the fuse links 315, is the shortest fuse link. In some embodiments, the fuse link Q3, although targeted to blow first from the fuse links 315, may not be the shortest fuse link. In some embodiments, multiple fuse links can be targeted to blow at approximately the same time. In such embodiments, the shape of the conductive fuse layer 310 can be modified so that the multiple fuse links can blow at approximately the same time.

In some embodiments, the shape of the conductive fuse layer 310 can be modified so that a different fuse link (other than fuse link Q3) such as fuse link Q2 will be targeted to blow first from the fuse links 315. In such embodiments, the fuse link Q2 can be associated with a tip of a triangular-shaped portion of the conductive fuse layer 310.

As shown in FIG. 3A, the fuse links 315 are each aligned along an axis (e.g., axis Z1) that is orthogonal to the outer edges 331, 334 of the respective conductive fuse buses 312, 313. In contrast, as shown in FIG. 3A, the fuse links 315 are each aligned along an axis that is not orthogonal to the inner edges (e.g., edges 332, 333) of the conductive fuse buses 312, 313. In some embodiments, the outer edge 331 may parallel to the outer edge 334. In some embodiments, the outer edge 331 may not be parallel to the outer edge 334. In such embodiments, one or more of the fuse links 315 may not be aligned along axes (or lines) orthogonal to one or more of the outer edges 331, 334.

Figure 3C:
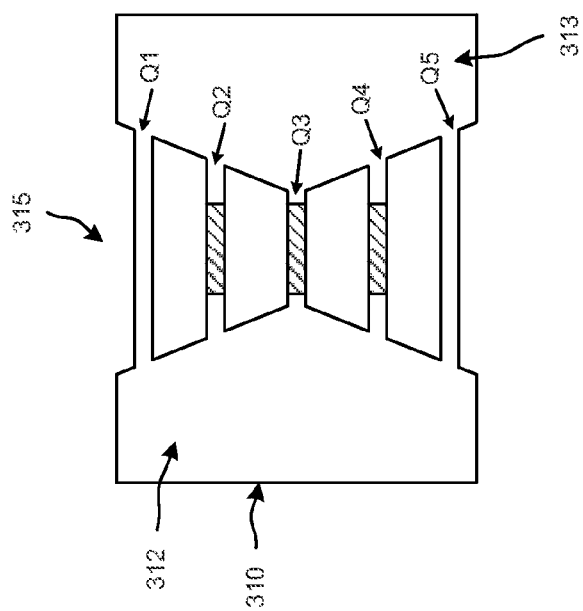

FIGS. 3B through 3D illustrate the fuse link blow order with which the fuse links 315 shown in FIG. 3A are blown. In this embodiment, the fuse links 315 are made of a material configured to physically change from a polysilicon material to a silicon dioxide material. The change to the silicon dioxide material is represented by a shaded area of the conductive fuse layer 310. Although not shown, in some embodiments, the conductive fuse layer 310 can be made of a metallic material configured to melt and physically deform when blown open.

The fuse link Q3 (shown in FIG. 3B) is configured to blow (or start to blow) first during a first time period. The fuse links Q2 and Q4 (shown in FIG. 3C) are configured to blow (or start to blow) during a second time period. The fuse links Q1 and Q5 (shown in FIG. 3D) are configured to blow (or start to blow) during a third time period.

In some embodiments, the first time period can overlap with (e.g., can have a common duration with) the second time period and/or the third time period. Similarly, in some embodiments, the second time period can overlap with (e.g., can have a common duration with) the first time period and/or the third time period. Similarly, in some embodiments, the second time period can overlap with (e.g., can have a common duration with) the first time period and/or the third time period. In some embodiments, the first time period can be mutually exclusive with (e.g., may not overlap with, may not have a common duration with) the second time period and/or the third time period. Similarly, in some embodiments, the second time period can be mutually exclusive with (e.g., may not overlap with, may not have a common duration with) the first time period and/or the third time period. In some embodiments, a duration of the first time period, a duration of the second time period, and a duration of the third time period can be the same. In some embodiments, a duration of the first time period can be different than a duration of the second time period and/or a duration of the third time period.

Figure 4:
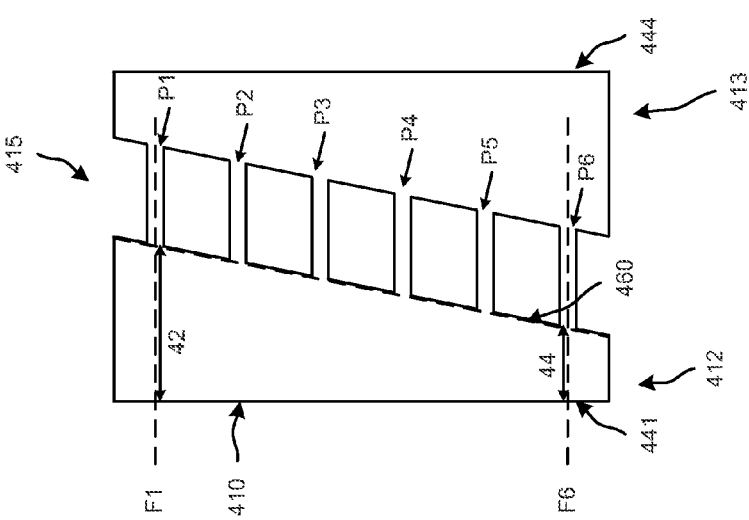
FIG. 4 is a diagram that illustrates another conductive fuse layer, according to an embodiment.

FIG. 4 is a diagram that illustrates a conductive fuse layer 410, according to an embodiment. As shown in FIG. 4, a conductive fuse layer 410 includes a left-side conductive fuse bus 412, a right-side conductive fuse bus 413, and fuse links 415. The fuse links 415 include fuse links P1 through P6.

In this embodiment, the conductive fuse layer 410 has a shape configured so that when a current is applied to the left-side conductive fuse bus 412, the fuse links 415 will blow in order from fuse link P1 to fuse link P6 (when the left-side conductive fuse bus 412 functions as the input of the conductive fuse layer 410). The order that the fuse links 415 are blown can be predefined based on the relative shapes of the left-side conductive fuse bus 412 and the right-side conductive fuse bus 413.

In this embodiment, the left-side conductive fuse bus 412 has a width associated with fuse link P1 that is greater than a width associated with fuse link P6. Specifically, fuse link P1 is aligned along an axis F1 (or also can be referred to as line F1) and the fuse link P6 is aligned along an axis F6 (or also can be referred to as line F6). A width 42 (e.g., an average width, a maximum width) of the left-side conductive fuse bus 412 along axis F1 (which is lateral to fuse link P1 and along which fuse link P1 is aligned) is greater than a width 44 (e.g., an average width, a maximum width) of the left-side conductive fuse bus 412 along axis F6 (which is lateral to fuse link P6 and along which fuse link P6 is aligned), in this embodiment, the width 42 of the left-side conductive fuse bus 412 associated with fuse link P1 is greater than the width (e.g., an average width, a maximum width) of the left-side conductive fuse bus 412 associated with any of the other fuse links P2 through P6. In this embodiment, the width 42 is greater than an average width of the conductive fuse layer 410, and the width 44 is less than an average width of the conductive fuse layer 410. As shown in FIG. 4, the axis F1 and the axis F6 are aligned along a plane within which the conductive fuse layer 410 is aligned.

As shown in FIG. 4, the tapering of the left-side conductive fuse bus 412 is opposite the tapering of the right-side conductive fuse bus 413. The width of the left-side conductive fuse bus 412 decreases from fuse link P1 to fuse link P6, and the width of the right-side conductive fuse bus 413 increases from fuse link P1 to fuse link P6. As shown in FIG. 4, the conductive fuse layer 410 has an area tapering at least along the edge 460 from a first width at a first portion of the area (e.g., adjacent to fuse link P1) to a second width at a second portion of the area (e.g., adjacent to fuse link P6).

As shown in FIG. 4, the left-side conductive fuse bus 412 has an edge 460 (represented by a dashed line) coupled to each of the fuse links 415. Although not shown in FIG. 4, the right-side conductive fuse bus 413 also has an edge coupled to each of the fuse links 415. In some embodiments, the edge 460 can be aligned along a straight line. Although not shown in FIG. 4, in some embodiments, the edge 460 can be curved. Although not shown in FIG. 4, in some embodiments, the edge 460 can have multiple different portions that are aligned along non-parallel lines or axes.

As shown in FIG. 4, the fuse links 415 are each aligned along an axis that is orthogonal to the outer edges 441, 444 of the respective conductive fuse buses 412, 413. In contrast, as shown in FIG. 4, the fuse links 415 are each aligned along an axis that is not orthogonal to the inner edges (e.g., edge 460) of the conductive fuse buses 412, 413. In some embodiments, the outer edge 441 may parallel to the outer edge 444. In some embodiments, the outer edge 441 may not be parallel to the outer edge 444. In such embodiments, one or more of the fuse links 415 may not be aligned along axes (or lines) orthogonal to one or more of the outer edges 441, 444.

Figure 5:
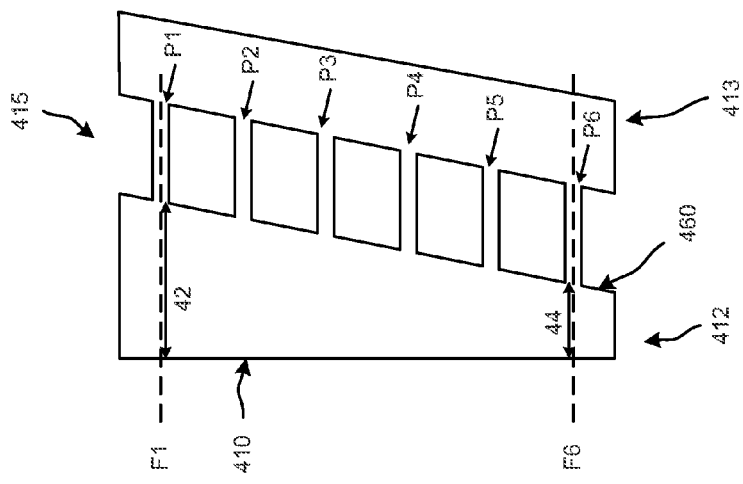
FIG. 5 is a diagram that illustrates a modified version of the conductive fuse layer shown in FIG. 4.

FIG. 5 is a diagram that illustrates a modified version of the conductive fuse layer 510 shown in FIG. 4. As shown in FIG. 5, the right-side conductive fuse bus 413 has a different shape than shown in FIG. 4. Specifically, it in this embodiment, the right-side conductive fuse bus 413 as a relatively constant width along the length (from the top of the figure to the bottom of the figure) of the conductive fuse bus 413.

Figure 6A:
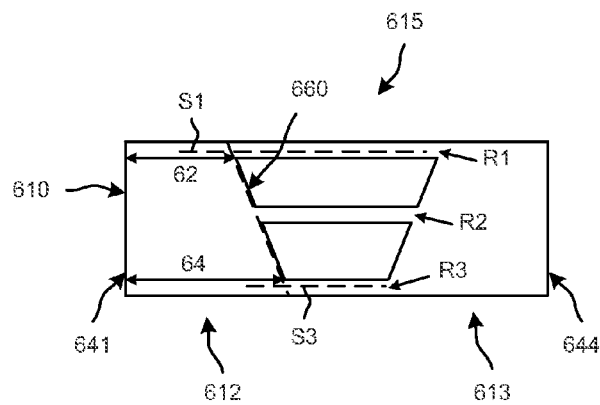
FIG. 6A is a diagram that illustrates another conductive fuse layer, according to an embodiment.

FIG. 6A is a diagram that illustrates a conductive fuse layer 610, according to an embodiment. As shown in FIG. 6A, a conductive fuse layer 610 includes a left-side conductive fuse bus 612, a right-side conductive fuse bus 613, and fuse links 615. The fuse links 615 include fuse links R1 through R3.

In this embodiment, the conductive fuse layer 610 has a shape configured so that when a current is applied to the left-side conductive fuse bus 612, the fuse links 615 will blow in order from fuse link R3 to fuse link R1 (when either of the conductive fuse buses 612, 613 functions as the input of the conductive fuse layer 610). The order that the fuse links 615 are blown can be predefined based on the relative shapes of the left-side conductive fuse bus 612 and the right-side conductive fuse bus 613. The order that the fuse links 615 are blown can be directly proportional to, or related to the current density flow through the fuse links 615 during operation (which is shown in FIG. 6B).

Figure 6B:
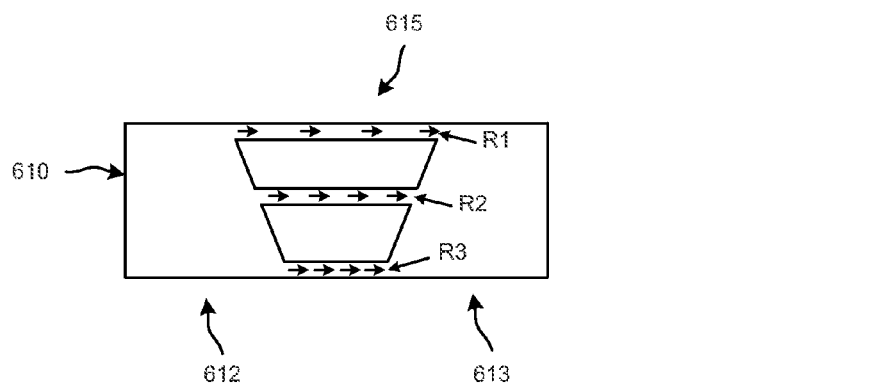
FIG. 6B is a diagram that illustrates current density flow through the fuse links shown in FIG. 6A during operation.

FIG. 6B is a diagram that illustrates current density flow through the fuse links 615 shown in FIG. 6A during operation. As shown in FIG. 6B, the current density is represented by the spacing between the arrows that represent the current flow. The current density through the fuse link R3 is greater the current density through the fuse link R2, and the current density through the fuse link R2 is greater the current density through the fuse link R1. Accordingly, the fuse links 615 will blow in order from fuse link R3 to fuse link R1 (when either of the conductive fuse buses 612, 613 functions as the input of the conductive fuse layer 610).

Figure 6C:
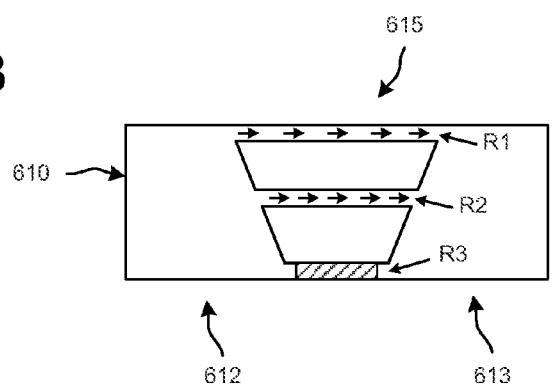
FIG. 6C is a diagram that illustrates an increase in current density through the fuse links shown in FIG. 6B after one of the fuse links has blown.

FIG. 6C is a diagram that illustrates an increase in current density in (e.g., current flow through) the fuse links 615 shown in FIG. 6B after one of the fuse links R3 has blown. A shaded area in fuse link R3 represents the blowing of fuse link R3. As shown in FIG. 6C, the current densities (which are represented by the spacing between the arrows that represent the current flow) of fuse link R1 and the fuse link R2 is increased compared with their respective current densities shown in FIG. 6B. Although not shown in FIG. 6C, fuse link R2 can blow in response to the increased current density in (e.g., current flow through) fuse link R2. The blowing of fuse link R2 (in addition to the blowing of fuse link R3) can result in a further increase in current density in fuse link R1 and subsequent blowing of fuse link R1.

in this embodiment, the left-side conductive fuse bus 612 has a width associated with fuse link R3 that is greater than a width associated with fuse link R1. Specifically, fuse link R3 is aligned along an axis S1 (or also can be referred to as line S1) and the fuse link R3 is aligned along an axis S3 (or also can be referred to as line S3). A width 64 (e.g., an average width) of the left-side conductive fuse bus 612 along axis S3 (which is lateral to fuse link R3 and along which fuse link R3 is aligned) is greater than a width 62 (e.g., an average width) of the left-side conductive fuse bus 612 along axis S1 (which is lateral to fuse link R1 and along which fuse link R1 is aligned). In this embodiment, the width 64 of the left-side conductive fuse bus 612 associated with fuse link R3 is greater than the width (e.g., an average width, a maximum width) of the left-side conductive fuse bus 612 associated with any of the other fuse links R2 or R1. In this embodiment, the width 64 is greater than an average width of the conductive fuse layer 610, and the width 62 is less than an average width of the conductive fuse layer 610. As shown in FIG. 6A, the axis S1 and the axis S3 are aligned along (or are within) a plane within which the conductive fuse layer 610 is aligned.

As shown in FIG. 6A, the tapering of the left-side conductive fuse bus 612 (which can be referred to as a triangular-shaped portion) is the same as the tapering of the right-side conductive fuse bus 613. The left-side conductive fuse bus 612 is mirrored by the right-side conductive fuse bus 613. The width of the left-side conductive fuse bus 612 increases from fuse link R1 to fuse link R3, and the width of the right-side conductive fuse bus 613 also increases from fuse link R1 to fuse link R3. In some embodiments, the outer edges 641, 644 of the conductive fuse buses 612, 613 can be tapered, curved, and/or so forth (and may not be parallel).

As shown in FIG. 6A, the left-side conductive fuse bus 612 has an edge 660 (represented by a dashed line) coupled to each of the fuse links 615. Although not shown in FIG. 6A, the right-side conductive fuse bus 613 also has an edge coupled to each of the fuse links 615, in some embodiments, the edge 660 can be aligned along a straight line. Although not shown in FIG. 6A, in some embodiments, the edge 660 can be curved. Although not shown in FIG. 6A, in some embodiments, the edge 660 can have multiple different portions that are aligned along non-parallel lines or axes.

As shown in FIG. 6A, these links 615 are each aligned along an axis that is orthogonal to the outer edges 641, 644 of the respective conductive fuse buses 612, 613. In contrast, as shown in FIG. 6A, the fuse links 615 are each aligned along an axis that is not orthogonal to the inner edges (e.g., edge 660) of the conductive fuse buses 612, 613. In some embodiments, the outer edge 641 may be parallel to the outer edge 644. In some embodiments, the outer edge 641 may not be parallel to the outer edge 644. In such embodiments, one or more of the fuse links 615 may not be aligned along axes (or lines) orthogonal to one or more of the outer edges 641, 644.

Figure 7:
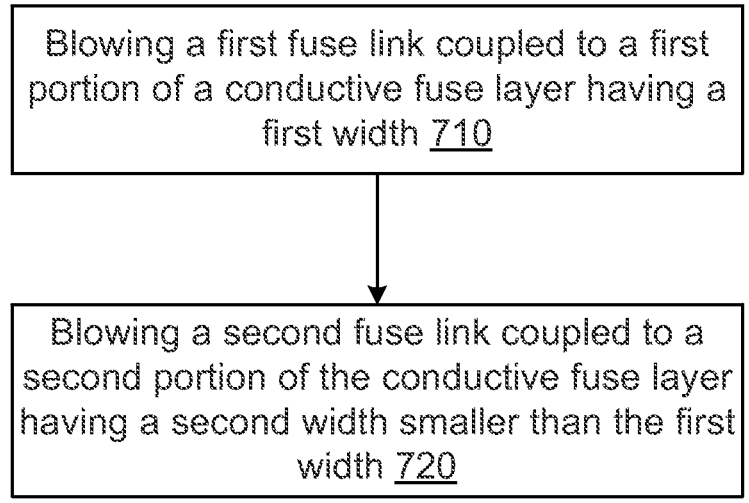
FIG. 7 is a flowchart that illustrates a method blowing fuses within a fuse device.

FIG. 7 is a flowchart that illustrates a method blowing fuses within a fuse device. In some embodiments, the fuse device can include any of the fuse devices shown and described above.

As shown in FIG. 7, a first fuse link coupled to a first portion of a conductive fuse layer having a first width is blown (block 710). In some embodiments, the width of the first portion can be aligned along an axis along which the first fuse link is also aligned. The first portion can be adjacent to and coupled to the first fuse link.

A second fuse link coupled to a second portion of the conductive fuse layer having a second width smaller than the first width is blown (block 720). The second fuse link that can be configured to start to blow after the first fuse link has started to blow. In some embodiments, the width of the second portion can be aligned along an axis along which the second fuse link is also aligned. The second portion can be adjacent to and coupled to the second fuse link. In some embodiments, the conductive fuse layer can taper down from the first width to the second width. The tapering can be along a length of the conductive fuse layer. In some embodiments, the first portion and the second portion can be included in a conductive fuse bus of the conductive fuse layer.

In some embodiments, the first fuse link can be blown during a first time period that is after a second time period during which the second fuse link can be blown. In some embodiments, the first time period and the second time period can be overlapping time periods or can be mutually exclusive time periods that do not overlap. In some embodiments, the conductive fuse layer can include a third fuse link that is configured to start to blow after the first fuse link has started to blow, but before the second fuse link has started to blow. In some embodiments, the blowing of one or more of the fuse links can include a chemical change (e.g., a change in state or composition) or physical change to the fuse link(s).

Figure 8:
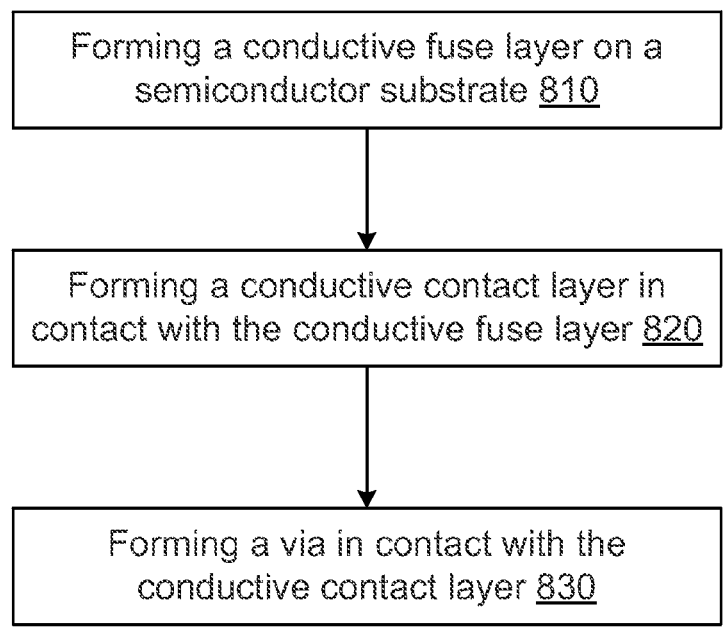
FIG. 8 is a flowchart that illustrates a method for producing a fuse device.

FIG. 8 is a flowchart that illustrates a method for producing a fuse device. In some embodiments, the fuse device can include any of the fuse devices shown and described above.

As shown in FIG. 8, a conductive fuse layer is formed on a semiconductor substrate (block 810). The conductive fuse layer can be in contact with the semiconductor substrate or can be insulated by a dielectric layer (previously formed) and/or disposed between the conductive fuse layer and the semiconductor substrate.

In some embodiments, the conductive fuse layer can be made of a polysilicon material and/or a silicided material. In some embodiments, the conductive fuse layer can be formed within at least one opening formed in (e.g., etched in, formed using photolithography process) a dielectric layer (e.g., an insulating layer, an oxide layer, a low-k dielectric layer). The dielectric layer can be formed on the semiconductor substrate before the conductive fuse layer is formed. In some embodiments, the conductive fuse layer can be formed by polishing (e.g., chemically and or mechanically polishing) a polysilicon material deposited on the dielectric layer (and in the opening(s) in the dielectric layer).

The conductive fuse layer can be formed using a semiconductor processing step such as a CVD processing step. In some embodiments, the conductive fuse layer can include a conductive fuse bus and a plurality of fuse links. The conductive fuse bus can have a triangular-shaped portion with a bottom surface aligned along a plane substantially parallel to a surface of the semiconductor substrate.

A conductive contact layer in contact with the conductive fuse layer can be formed (block 820). In some embodiments, the conductive contact layer can be, for example, a metallic material that is deposited using a semiconductor process step (e.g., a CVD or PVD processing step).

A via in contact with the conductive contact layer is formed (block 830). In some embodiments, the via can be formed in an opening formed within a dielectric layer. The dielectric layer, through which the via is formed, can be formed after the conductive fuse layer and/or the conductive contact layer are formed.

In some embodiments, the fuse devices described herein can be integrated in a variety of computing devices. For example, the fuse devices described herein can be included in, for example, a mobile computing device. In some embodiments, the fuse devices described herein can be included in, for example, a tablet computer, a laptop computer, a personal digital assistant (PDA), a host computer, a television, an electronic measurement device, a data analysis device, a cell phone, a smartphone, an electronic device, and/or so forth.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
a semiconductor substrate;
a conductive fuse layer having a bottom surface aligned along a plane substantially parallel to a surface of the semiconductor substrate and having an area tapering along an edge from a first width at a first portion of the area to a second width at a second portion of the area;
a first fuse link aligned along the plane and coupled to the edge of the area at the first portion of the area; and
a second fuse link aligned along the plane and coupled to the edge of the area at the second portion of the area,
the area of the conductive fuse layer tapering from a first width at the first portion to a second width at the second portion,
the first fuse link being associated with a current density larger than a current density associated with the second fuse link based on the tapering of the area,
the first fuse link sequentially blowing before the second fuse link based on the current density associated with the first fuse link, and
the conductive fuse layer, the first fuse link and the second fuse link are formed of a same material.

2. The apparatus of claim 1, wherein the same material is a polysilicon material.

3. The apparatus of claim 1, wherein the first fuse link has a length longer than a length of the second fuse link.

4. The apparatus of claim 1, wherein the edge is a first edge of the conductive fuse layer non-parallel to a second edge of the area of the conductive fuse layer, at least one of the first fuse link or the second fuse link is aligned along an axis orthogonal to the second edge.

5. The apparatus of claim 1, wherein the area is a first area, the conductive fuse layer has a second area aligned along the plane and electrically coupled to the first area via the first fuse link and via the second fuse link.

6. The apparatus of claim 1, wherein the area is a first conductive fuse bus, the conductive fuse layer has a second conductive fuse bus aligned along the plane and has an edge aligned along a line non-parallel to a line along which the edge of the first conductive fuse bus is aligned.

7. The apparatus of claim 1, wherein the area is a first conductive fuse bus, the conductive fuse layer has a second conductive fuse bus aligned along the plane and has an edge tapering away from the edge of the first conductive fuse bus.

8. The apparatus of claim 1, wherein the area has a length greater than at least one of the first width or the second width, the length of the area is aligned along a longitudinal axis, the first width and the second width are orthogonal to the longitudinal axis.

9. The apparatus of claim 1, wherein the first fuse link is substantially straight and the second fuse link is substantially straight, the first fuse link is substantially parallel to the second fuse link.

10. The apparatus of claim 1, wherein the first fuse link has a cross-sectional area different than a cross-sectional area of the second fuse link.

11. An apparatus, comprising:
a semiconductor substrate;
a first conductive fuse bus having a triangular-shaped portion with a bottom surface aligned along a plane substantially parallel to a surface of the semiconductor substrate;
a second conductive fuse bus having a bottom surface aligned along the plane; and
a plurality of fuse links coupled between the triangular-shaped portion of the first conductive fuse bus and the second conductive fuse bus,
the area of the conductive fuse bus tapering from a first width at the first portion to a second width at the second portion,
the first fuse link being associated with a current density larger than a current density associated with the second fuse link based on the tapering of the bus,
the first fuse link sequentially blowing before the second fuse link based on the current density associated with the first fuse link, and
the first conductive fuse bus, the second conductive fuse bus and the plurality of fuse links being formed of a same material.

12. The apparatus of claim 11, wherein the triangular-shaped portion has an a first portion of an inner edge and a second portion of the inner edge, at least a first portion of the plurality of fuse links are coupled between the first portion of the inner edge of the triangular-shaped portion and the second conductive fuse bus, at least a second portion of the plurality of fuse links are coupled between the first portion of the inner edge of the triangular-shaped portion and the second conductive fuse bus.

13. The apparatus of claim 11, wherein the second conductive fuse bus has a triangular-shaped portion.

14. The apparatus of claim 11, wherein the triangular-shaped portion has a resistance gradient configured such that a current density through a first fuse link from the plurality of fuse links is different than a current density through a second fuse link from the plurality of fuse links when a current is applied to the first conductive fuse bus.

15. The apparatus of claim 11, wherein the second conductive fuse bus has triangular-shaped portion, the triangular-shaped portion of the second conductive fuse bus is mirrored across the plurality of fuse links by the triangular-shaped portion of the first conductive fuse bus.

16. The apparatus of claim 11, wherein a fuse link from the plurality of fuse links targeted for blowing before the remaining fuse links from the plurality of fuse links is coupled between a tip of the triangular-shaped portion of the first conductive fuse bus and the second conductive fuse bus.

17. An apparatus, comprising:
a semiconductor substrate; and
a fuse structure operatively coupled to the semiconductor substrate, the fuse structure including:
a first conductive fuse bus,
a second conductive fuse bus, and
a plurality of fuse links operatively coupled to the semiconductor substrate and coupled between the first conductive fuse bus and the second conductive fuse bus, a first fuse link from the plurality of fuse links being disposed between a second fuse link from the plurality of fuse links and a third fuse link from the plurality of fuse links, the first conductive fuse bus being configured such that the first fuse link starts to blow open in response to a current before the second fuse link or the third fuse link starts to blow open in response to the current, wherein the area of the conductive fuse bus tapering from a first width at the first portion to a second width at the second portion,
the first fuse link being associated with a current density larger than a current density associated with the second fuse link based on the tapering of the bus,
the first fuse link sequentially blowing before the second fuse link based on the current density associated with the first fuse link, and
at least two of the plurality of fuse links having a different length.

18. The apparatus of claim 17, wherein at least one of the first conductive fuse bus or the second conductive fuse bus has a triangular-shaped portion.

19. The apparatus of claim 17, wherein the first fuse link from the plurality of fuse links changes from a conductive state to a high resistance state when the first fuse link from the plurality of fuse links blows open.

20. The apparatus of claim 1, wherein the first fuse link is aligned along a first axis at an angle with respect to a second axis along which the second fuse link is aligned.

* * * * *

UNITED STATES PATENT AND TRADEMARK OFFICE
CERTIFICATE OF CORRECTION

| | | |
|---|---|---|
| PATENT NO. | : 8,866,256 B2 | Page 1 of 1 |
| APPLICATION NO. | : 13/601510 | |
| DATED | : October 21, 2014 | |
| INVENTOR(S) | : William R. Newberry | |

It is certified that error appears in the above-identified patent and that said Letters Patent is hereby corrected as shown below:

In the Claims

In column 19, line 57, in claim 12, delete "an a" and insert -- a --, therefor.

Signed and Sealed this
Eleventh Day of August, 2015

Michelle K. Lee
*Director of the United States Patent and Trademark Office*